United States Patent [19]

Conkle et al.

[11] Patent Number: 4,894,558

[45] Date of Patent: Jan. 16, 1990

[54] POWER SAVING INPUT BUFFER FOR USE WITH A GATE ARRAY

[75] Inventors: Cecil Conkle, Palo Alto, Calif.; Masahiko Shoji; Noriaki Takagi, both of Tokyo, Japan

[73] Assignees: NEC Electronics Inc., Mountain View, Calif.; NEC Corporation, Tokyo, Japan

[21] Appl. No.: 255,227

[22] Filed: Oct. 11, 1988

[51] Int. Cl.[4] .............. H03K 19/096; H03K 19/003; H03K 17/687; H03K 3/013

[52] U.S. Cl. .................. 307/296.3; 307/465; 307/469; 307/473; 364/716; 365/189.07

[58] Field of Search .............. 307/443, 448, 451, 452, 307/765, 468, 469, 296, 3, 296.1, 296.6, 473; 364/716; 371/10

[56] References Cited

U.S. PATENT DOCUMENTS

| | | | |
|---|---|---|---|
| 4,511,812 | 4/1985 | Satake | 307/465 |
| 4,697,105 | 9/1987 | Moy | 307/465 |
| 4,764,691 | 8/1988 | Jochem | 307/465 X |
| 4,791,603 | 12/1988 | Henry | 307/465 X |
| 4,825,098 | 4/1989 | Aoyama | 307/465 X |
| 4,839,539 | 6/1989 | Takata et al. | 307/465 |

*Primary Examiner*—Andrew J. James
*Assistant Examiner*—David R. Bertelson
*Attorney, Agent, or Firm*—Skjerven, Morrill, MacPherson, Franklin & Friel

[57] ABSTRACT

The present invention incorporates a control mechanism in an input buffer for a gate array so that the input buffer may be directly enabled or disabled by a control signal. Hence, no power will be wasted by the unnecessary operation of gates internal to the input buffer or subsequent stages. The method of control is to couple a common control signal to one input port of each of a plurality of two-input AND gates and couple an incoming data signal to the other input port of each of the two-input AND gates. The AND gates function as input buffers and the outputs of the AND gates are applied to the subsequent stage (e.g., a gate array). Thus, a LOW control signal disables the AND gate input buffers and subsequent stages coupled to the outputs of the AND gates, regardless of whether the incoming data signals are of a HIGH or LOW state.

7 Claims, 2 Drawing Sheets

POWER SAVING INPUT BUFFER FOR USE WITH A GATE ARRAY

FIELD OF THE INVENTION

This invention relates to input buffers and in particular to an input buffer for use with a gate array or other master slice integrated circuit device.

BACKGROUND OF THE INVENTION

In a standard prior art gate array circuit, such as a programmable logic type array or other master slice type device, a plurality of input buffers are coupled between the gate array and incoming data signal lines to match the levels of the incoming data signals to the signal levels required for the gate array and to protect the gate array from noise on the data signal lines. Further, a plurality of output buffers are connected to the outputs of the gate array to amplify the gate array signals in order to drive a next stage. A simplified block diagram showing these three basic components of a gate array circuit is shown in FIG. 1. FIG. 1 includes input buffers 10, gate array 20, and output buffers 30.

A problem with prior art gate array circuits such as shown in FIG. 1 is that, since input lines 12 of input buffers 10 are usually coupled to a data bus, the various signals on the data bus will cause gates within input buffers 10 to change states, which, in turn, cause corresponding changes of state of gates within gate array 20 and output buffers 30. These changes of state occur even when the outputs of output buffers 30 are not being inspected, or, in other words, when operation of input buffers 10, gate array 20, and output buffers 30 is not required. When gates are switched, there is feedthrough current during switching, and, if the next stage is a capacitive load, there is a charge current which charges the capacitive load. Consequently, when the operation of input buffers 10, gate array 20, and output buffers 30 is not required, there is a resulting wasteful use of electrical power in their operation.

This is a particular problem when a battery driven memory card is connected to a gate array circuit. In this case, the battery driven memory card uses up battery power in changing logic states within the card, as determined by the signals on a data bus, even when the operation of the memory card is not required.

Even if gate array 20 in FIG. 1 were equipped with a control terminal which disabled gate array 20 upon application of a control voltage, input buffers 10 would not be rendered inoperative and power will still be wasted by input buffers 10.

Hence, the above-described prior art gate array circuits do not allow for directly controlling the input buffers so as to only operate when needed.

SUMMARY OF THE INVENTION

The present invention incorporates a control mechanism in an input buffer so that the input buffer may be directly enabled or disabled by a control signal. When operation of the input buffer and subsequent stages are not required, no changes of state will occur, and, hence, no power will be wasted by the unnecessary operation of gates internal to the input buffer or subsequent stages. The method of control is to couple a common control signal to one input port of each of a plurality of two-input AND gates and couple an incoming data signal to the other input port of each of the two-input AND gates. The AND gates function as input buffers and the outputs of the AND gates are applied to the subsequent stage (e.g., a gate array). Thus, the output of each of the AND gates will be automatically LOW when a LOW control signal is applied to one input of the two-input AND gate, and an AND gate output signal will be HIGH when the control signal is held HIGH and the incoming data signal applied to the other input of the AND gate is also at a HIGH level. When the control signal is HIGH and the data signal applied to the other input of the AND gate is LOW, the output of that particular AND gate will also be LOW, hence, reflecting the state of the data signal. Thus, a LOW control signal disables the AND gate input buffers and subsequent stages coupled to the output of the AND gates, such as a gate array, regardless of whether the incoming data signals are of a HIGH or LOW state, hence, wasting no power when operation of the circuits is not required.

DETAILED DESCRIPTION OF THE INVENTION

Figure 1:
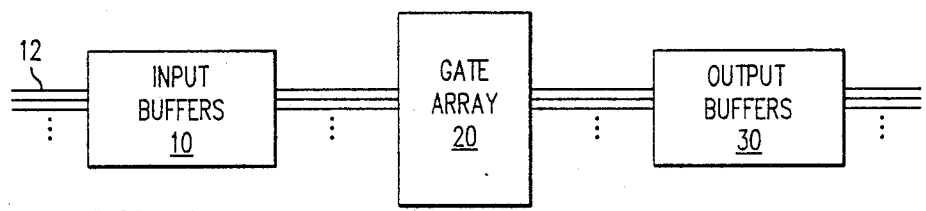
FIG. 1 is a block diagram showing a prior art gate array coupled to a plurality of input buffers and output buffers.
Figure 2:
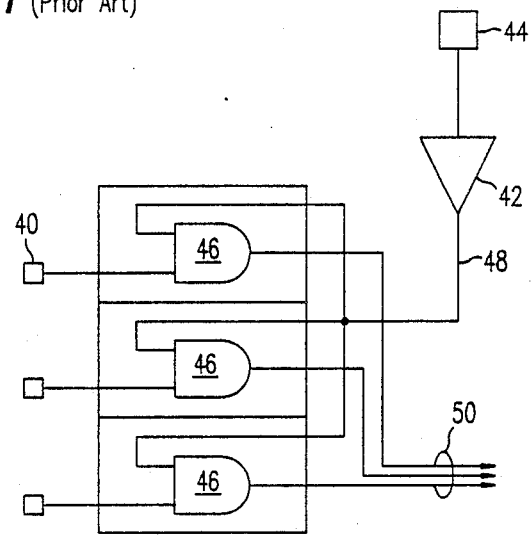
FIG. 2 is a schematic diagram of one embodiment of our invention.

FIG. 2 shows a circuit diagram of the present invention. FIG. 2 shows data signal input pads 40 for receiving an incoming data signal, a control signal buffer 42, a control signal input pad 44, and two-input AND gates 46 each having one input terminal coupled to a corresponding data signal input pad 40 and having the other input terminal coupled to a common control signal line 48. Outputs of AND gates 46 are shown as output lines 50 and are coupled to a next stage which may comprise additional input buffers or a gate array depending on whether additional input buffers are needed. When a HIGH signal enters control signal buffer 42, which may be an ordinary prior art input buffer, a HIGH output signal of control signal buffer 42 is applied to one input of each two-input AND gate 46. Hence, an incoming data signal applied to any of pads 40 is reflected at the output of an associated two-input AND gate 46 and is fed to the next stage via an associated one of output lines 50.

When a LOW signal is applied to control signal buffer 42, a LOW output signal of control signal buffer 42 is applied to one of the inputs of each two-input AND gate 46, insuring the voltages on output lines 50 are LOW regardless of the state of the data signals applied to pads 40. Hence, the next stage coupled to output lines 50 is unaffected by the incoming data signals. In this way, no power is wasted by either AND gates 46 or the subsequent stages coupled to output lines 50 when their operation is not required. Thus, where AND gates 46 and subsequent stages are comprised of CMOS devices, the disabling of these devices by a LOW control signal will suppress the feed-through current during switching of the CMOS devices. Further, if a subsequent stage is a capacitive load, the charge current is also suppressed.

Figure 3:
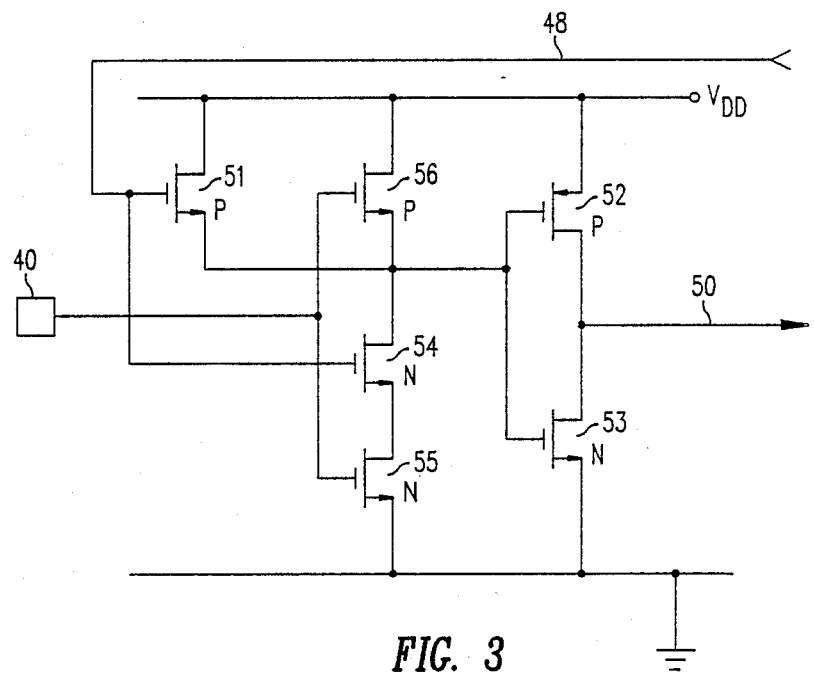
FIG. 3 is a schematic diagram of an AND gate of FIG. 2 using CMOS technology.

In one embodiment, the two input AND gates 46 of FIG. 2 are formed using CMOS devices with a circuit diagram as shown in FIG. 3. In FIG. 3, if the level of control signal line 48 is LOW, the signal on output line 50 will be LOW regardless of whether the level of the data signal applied to data input pad 40 is HIGH or LOW. In this manner, the use of the present invention avoids the waste of charge current and feed-through current into a subsequent gate array stage and subsequent output buffer stage.

Operation of the circuit of FIG. 3 is as follows. When control signal line 48 is LOW, PMOS transistor 51, whose gate is coupled to control signal line 48 and whose source is coupled to positive voltage $V_{DD}$, is on and applies a HIGH voltage to the gates of PMOS transistor 52 and NMOS transistor 53. PMOS transistor 52 and NMOS transistor 53 are coupled in series between $V_{DD}$ and ground so that a HIGH voltage coupled to their gates turns NMOS transistor 53 on and PMOS transistor 52 off, coupling a LOW voltage to output line 50.

The LOW voltage on control signal line 48 is also coupled to the gate of NMOS transistor 54, whose source is coupled to ground through NMOS transistor 55 and whose drain is coupled to $V_{DD}$ through PMOS transistor 56 and to the gates of PMOS transistor 52 and NMOS transistor 53. Hence, a low voltage on control signal line 48 turns NMOS transistor 54 off, isolating the gates of PMOS transistor 52 and NMOS transistor 53 from NMOS transistor 55 and ground. An incoming data signal applied to pad 40 is coupled to the gates of PMOS transistor 56 and NMOS transistor 55 so that if the data signal is LOW, PMOS transistor 56 would conduct, causing no change in the HIGH voltage already applied to the gates of PMOS transistor 52 and NMOS transistor 53 through the conductive PMOS transistor 51. If the incoming data signal is high, NMOS transistor 55 would conduct, having no effect on the voltage coupled to the gates of PMOS transistor 52 and NMOS transistor 53, since NMOS transistor 55 is isolated by NMOS transistor 54 being in an off state by the LOW control signal line 48.

A HIGH voltage on control signal line 48 switches off PMOS transistor 51 and switches on NMOS transistor 54, causing the state of the data signal applied to pad 40 to be reflected on output line 50.

Figure 4:
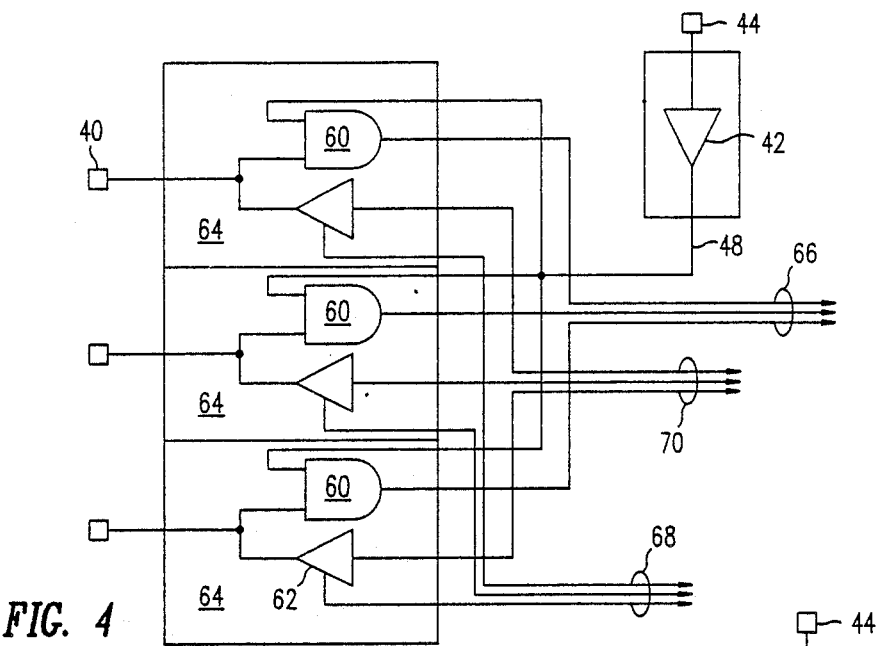
FIG. 4 shows another embodiment of our invention where a control signal is applied to an input/output buffer.

FIG. 4 shows another embodiment of the present invention. In this embodiment, both incoming data signals and buffered output signals from a gate array are coupled to pad 40. In FIG. 4, each combination of AND gate 60 and tri-state buffer 62 comprises an input-/output (I/O) buffer 64. The output of each AND gate 60 is coupled to one of output lines 66. Also shown are tri-state buffer control signal lines 68 and tri-state buffer input signal lines 70. The signals on input signal lines 70 are taken from the output signals of a subsequent stage gate array. Control signals on control signal lines 68 control the output of tri-state buffers 62 to be either a buffered version of the signals on input signal lines 70 or floating. Control signal lines 68 may be coupled together so as to apply a common control signal to all tri-state buffers 62 or may be separate to have independent control over each tri-state buffer 62. The control signal on control signal lines 68 may be generated by a gate array coupled to output lines 66. The outputs of tri-state buffers 62 are coupled to pads 40 so that when tri-state buffers 62 are enabled by a certain control signal on control signal lines 68, pad 40 is to be used as an output port, and when tri-state buffers 62 are disabled by a certain control signal, causing the output of tri-state buffers 62 to be floating, a data input signal may be applied to pad 40, causing pad 40 to be used as an input port.

Further, as another use of the configuration of FIG. 4, the outputs of tri-state buffers 62 may be used as an input to an associated AND gate 60. Other components shown in FIG. 4 are identical to those in FIG. 3.

By setting the control signal line 48 to LOW, the output of AND gates 60 coupled to output lines 66 will be LOW regardless of the data signals applied to pads 40 and the outputs of tri-state buffers 62.

Figure 5:
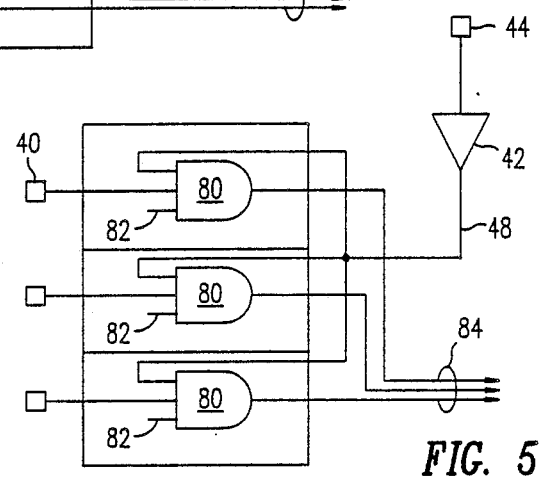
FIG. 5 shows another embodiment of our invention allowing selective enabling of each input buffer.
Figure 6:
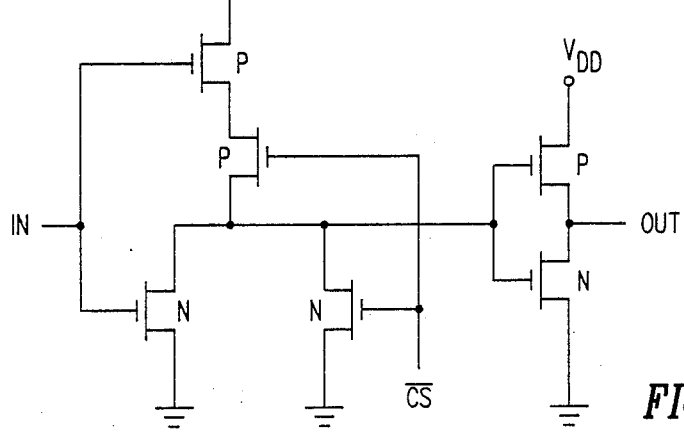
FIGS. 6-9 are schematic diagrams of alternate embodiments of an AND gate of FIG. 2 using CMOS technology.
Figure 7:
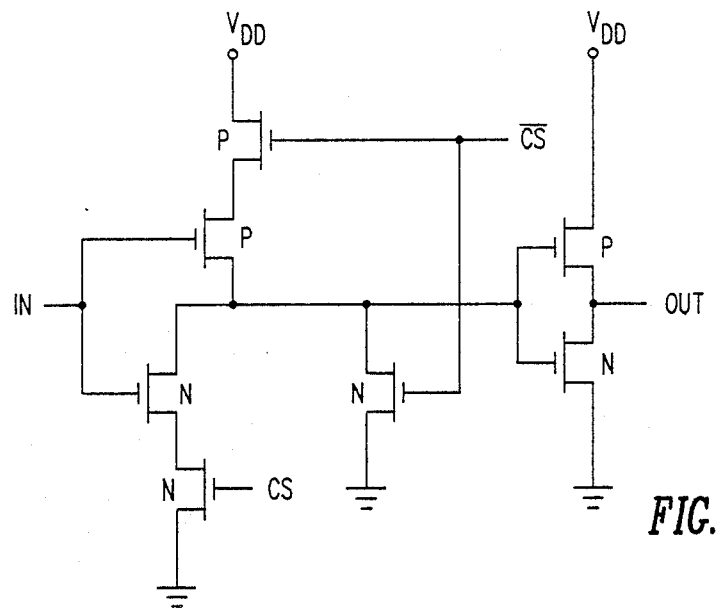
Figure 8:
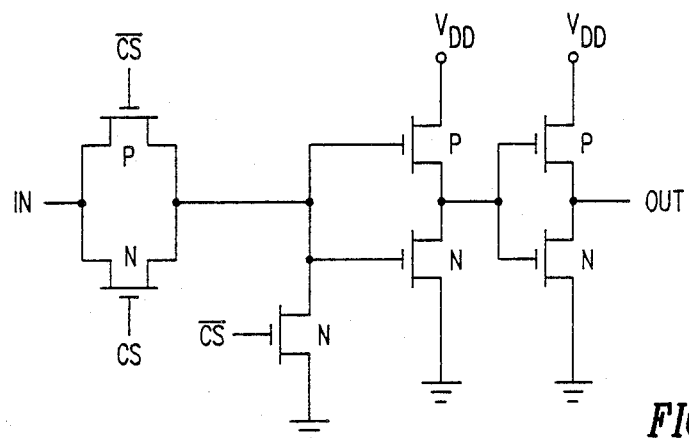
Figure 9:
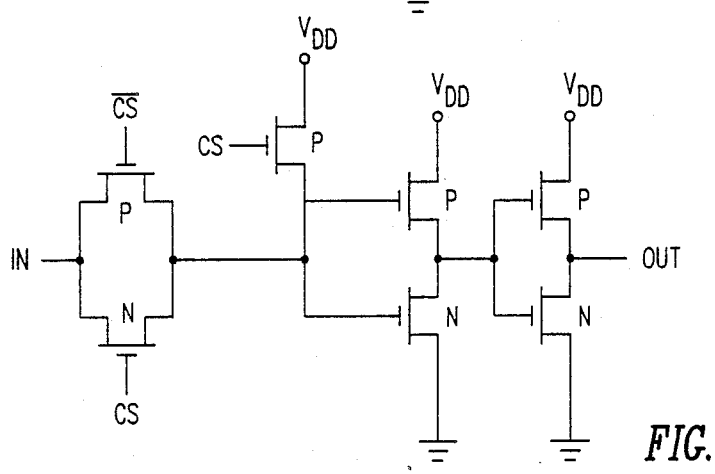

FIG. 5 shows another embodiment of the present invention where each three-input AND gate 80 has a first input being a voltage applied to an associated pad 40, a second input being a first control signal on control signal line 48, and a third input being a second control signal 82, wherein each second control signal 82 is generated independently from one another and may be generated by a gate array coupled to output lines 84 of AND gates 80. Hence, selective enabling of AND gates 80 is possible with the inventive circuit of FIG. 5, thereby allowing only gates whose operation is required within a subsequent stage to change state.

FIGS. 6 through 9 illustrate further embodiments of a two input AND gate, such as AND gates 46 and 60 in FIGS. 2 and 4, respectively, using CMOS technology. Operation of these circuits is straightforward and their operation will not be discussed in detail. In the circuits of FIGS. 6 through 9, the respective outputs are driven automatically to a predetermined level, either high or low, depending on the specific embodiment, upon application of a low control signal CS and a high inverse control signal $\overline{CS}$, regardless of the level of input signal IN.

Additional embodiments of our inventive input buffers using the concepts disclosed herein will become obvious to those of ordinary skill in the art.

We claim:

1. A device for conserving power in a gate array circuit comprising:
   means for supplying a first control signal;
   AND gate means having a first input port and a second input port and providing a first output signal, said first control signal being applied to said first input port and a first signal being applied to said second input port, wherein said first output signal is coupled to a gate array means and follows said first signal when said first control signal represents a logical one and represents a logical zero when said first control signal represents a logical zero.

2. The device of claim 1 wherein said AND gate means functions as one of a plurality of identical input buffers for said gate array means.

3. The device of claim 2 wherein said AND gate means is constructed using CMOS transistor technology.

4. The device of claim 2 wherein said first control signal applied to said first input port of each of said plurality of input buffers is common to each of said plurality of input buffers.

5. The device of claim 2 wherein each of said plurality of input buffers further comprises a input port for having applied thereto a control signal for independently controlling each of said input buffers, wherein if said control signal associated with a particular input buffer is a logical zero, an output of said input buffer will automatically be a logical zero.

6. The device of claim 2 further comprising a tri-state buffer means having a input port and a control signal input port and providing a output signal coupled to said second input port of said AND gate means, said control signal input port of said tri-state buffer means being coupled to a second control signal which enables or disables said tri-state buffer means, said input port of said tri-state buffer means being coupled to a output signal of said gate array means so that said second input port of said AND gate means may be selectively used as either an input port for said first signal or an output port for said output signal of said tri-state buffer means.

7. The device of claim 6 wherein said control signal of said tri-state buffer means is determined by a second output signal of said gate array means coupled to receive said first output signal of said AND gate means.

* * * * *